(12) United States Patent
Saeki (10) Patent No.: US 6,509,775 B2
(45) Date of Patent: Jan. 21, 2003

(54) SYNCHRONOUS DELAY CIRCUIT AND SEMICONDUCTOR INTEGRATED CIRCUIT APPARATUS

(75) Inventor: Takanori Saeki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/799,543

(22) Filed: Mar. 5, 2001

(65) Prior Publication Data

US 2001/0020859 A1 Sep. 13, 2001

(30) Foreign Application Priority Data

Mar. 6, 2000 (JP) ........................................ 2000-060101

(51) Int. Cl.$^7$ .............................................. H03H 11/26
(52) U.S. Cl. ....................................... 327/271; 327/270
(58) Field of Search .................................. 327/161, 163, 327/153, 165, 166, 261, 263, 264, 276, 277, 270, 271, 272, 278

(56) References Cited

U.S. PATENT DOCUMENTS

| | | | | |
|---|---|---|---|---|
| 6,060,920 A | * | 5/2000 | Saeki | 327/152 |
| 6,075,395 A | * | 6/2000 | Saeki | 327/161 |
| 6,222,408 B1 | * | 4/2001 | Saeki | 327/271 |
| 6,278,309 B1 | * | 8/2001 | Saeki | 327/153 |

FOREIGN PATENT DOCUMENTS

| | | |
|---|---|---|
| EP | 0 829 964 A2 | 3/1998 |
| EP | 0 896 432 A1 | 2/1999 |
| JP | 8237091 | 9/1996 |
| JP | 10-150350 | 6/1998 |
| JP | 11-068729 | 3/1999 |
| JP | 11-112309 | 4/1999 |
| JP | 2000194441 | 7/2000 |

OTHER PUBLICATIONS

Jin–Man Han, et al. Skew Minimization Techniques for 256m–bit Synchronous DRAM and Beyond. Symposium on VLSI Circuits Digest of Technical Papers, 1996.
Richard B. Watson, Jr., et al. Clock Buffer Chip with Absolutes Delay Regulation Over Process and Environmental Variations. Custom Integrated Circuits Conference, 1992.
Yoshinovi Orajima, et al, Digital Delay Locked Loop and Design Technique for High–Speed Synchronous Interface. Trans Electron, vol. e19–c, No. 6 Jun. 1996.

* cited by examiner

Primary Examiner—Timothy P. Callahan
Assistant Examiner—Linh Nguyen
(74) Attorney, Agent, or Firm—Katten Muchin Zavis Rosenman (57) ABSTRACT

A synchronous delay circuit apparatus include two sets of synchronous delay circuits 100, 101 each including a first delay circuit chain for period measurement in which input clocks propagate and a second delay circuit chain for period reproduction and delay detection circuits 5, 7 for detecting the propagation delay time caused in propagating clocks from an input node to an output node of a clock propagation path to issue a control signal for halting propagation of the input clock signals to the respective synchronous delay circuits. A delay circuit 6 is introduced in an input of at least one of the delay detection circuits to differentiate a delay time detected in one delay detection circuit 7 from a delay time detected by the other delay detection circuit 5 to differentiate detected period from the delay detected in the other delay detection circuit 5. Even when the propagation delay time in the clock propagation path 4 becomes longer or shorter than the clock period, no discontinuity in the clocks supplied from the synchronous delay circuit to the clock propagation path.

15 Claims, 10 Drawing Sheets

FIG. 7 PRIOR ART
FOR tCTS < tCK

FIG. 8 PRIOR ART
FOR tCTS > tCK

SYNCHRONOUS DELAY CIRCUIT AND SEMICONDUCTOR INTEGRATED CIRCUIT APPARATUS

FIELD OF THE INVENTION

This invention relates to a clock control technique for a semiconductor integrated circuit and, more particularly, to a synchronous delay circuit for controlling clock signals and to a semiconductor integrated circuit apparatus having such synchronous delay circuit.

BACKGROUND OF THE INVENTION

A synchronous delay circuit for eliminating clock skew within a short synchronous time period has come to be used in the high-speed clock synchronization circuit because of its simplified circuit structure and only low power consumption. For this sort of the synchronous delay circuit, reference may be had e.g., to the following publications:

[1] JP Patent Kokai JP-A-8-237091;

[2] JP Patent Kokai JP-A-11-73238 (U.S. Pat. No. 6,075, 395);

[3] Jin-Man Han et al., Skew Minimization Technique for 256M-bit Synchronous DRAM and Beyond, 1996 Symp. on VLSI Circ. pp. 192–193;

[4] Richard B. Watson et al., Clock Buffer Chip with Absolute Delay Regulation Over Pricrss and Environment Variations, Proc. of IEEE 1992 CICC (Custom Integrated Circuits Conference), 25.2;

[5] Yoshihiro OKAJIMA et al., Digital Delay locked Loop and Design Technique for High-Speed Synchronous Interface, IEICE TRANS. ELECTRON., Vol. E79-C, No. 6, June 1996, pp. 798–807.

Figure 5:
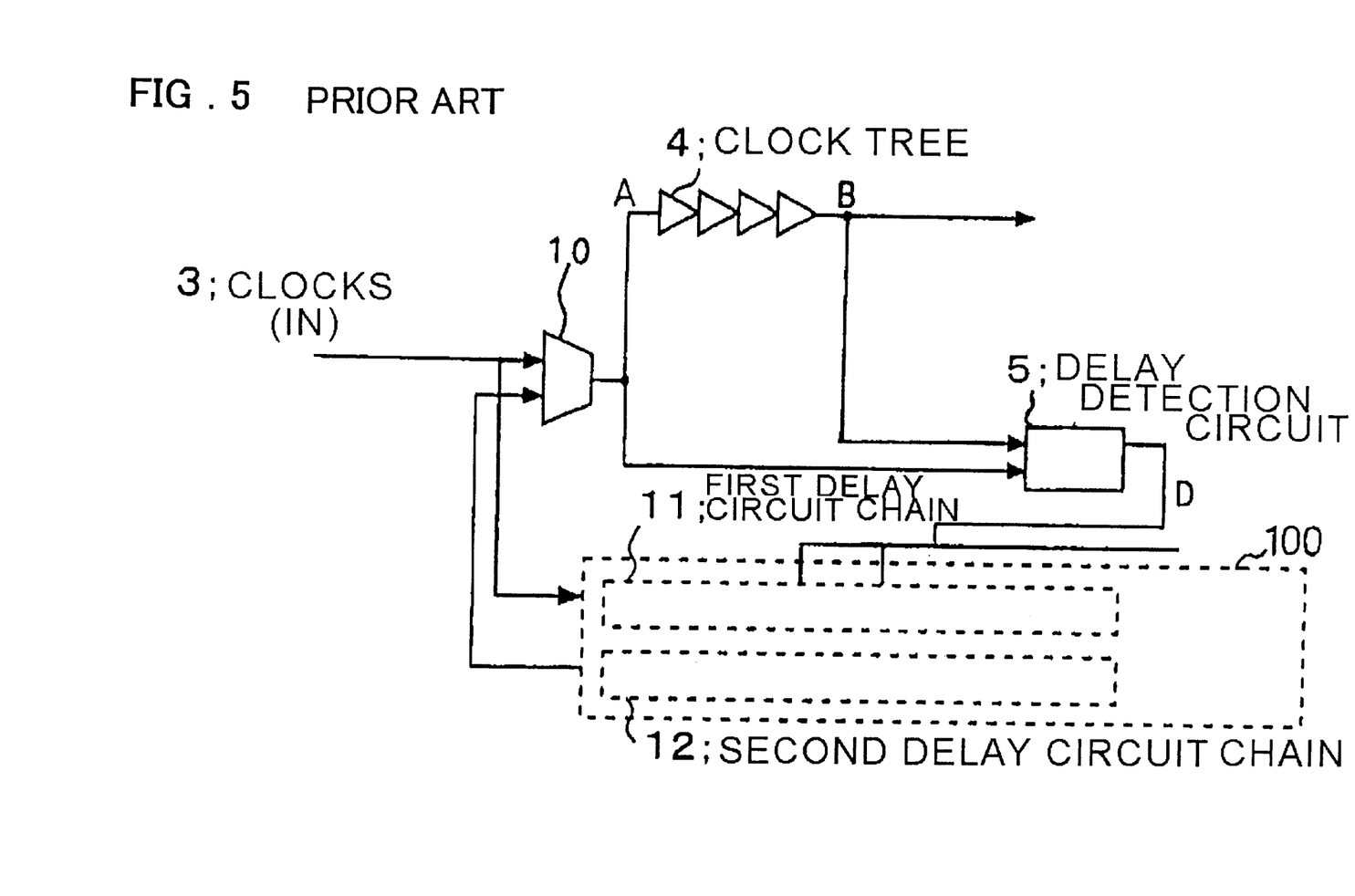
FIG. 5 illustrates the structure of a conventional synchronous delay circuit.

FIG. 5 shows an illustrative structure of a semiconductor integrated circuit having a conventional synchronous delay circuit. Meanwhile, the structure shown in FIG. 5 is based on the structure of the synchronous delay circuit described in the publication [2] (JP-A-11-73238) filed by the same applicant.

A synchronous delay circuit 100 includes, as its basic structure, a first delay circuit delay circuit chain 11 for period (delay) measurement, adapted for Propagation of clock Pulses or clock Pulse edges therein, and a second delay circuit chain 12 for delay reproduction, capable of propagation of pulses or pulse edges by a length corresponding to a length of the propagation of the pulse or pulse edges through the first delay circuit chain 11.

The configuration shown in FIG. 5 is designed so that the clock period tCK of the input clocks 3 less the delay tCTS of a clock tree 4, as detected by a delay detection circuit 5 as later explained, or tCK–tCTS, is measured by the synchronous delay circuit 100, in consideration of fluctuations in the propagation delay time of the clock tree 4, to realize clocks substantially free of skew with respect to input clocks 4 even if the propagation delay time tCTS of the clock tree 4 is changed.

In designing a semiconductor integrated circuit, there is used e.g., the designing by the clock tree synthesis (CTS) method of optimally introducing a buffer for equalizing the delay in the clock signal wiring network to provide a tree-like layout, in order to minimize the difference in clock signal delay time, in such a manner as to distribute clock signals in respective clock using circuits, such as flipflops. The clock tree 4 is made up of clock wiring routes laid out in a tree fashion. In FIG. 5, a triangular symbol of the clock tree 4 schematically denotes a buffer inserted in the clock tree for equalizing the delay in driving the load. It should be noted that the clock tree 4 is shown only schematically such that the number of stages of the buffer circuits comprehended in the clock tree 4 is not necessarily limited to four. In FIG. 5, A denotes an input node of the clock tree 4 and B a preset output node, such as a maximum delay node, as selected as a control object in the clock tree 4. Meanwhile, the clock propagation Path arranged in the clock tree 4 might be any suitable clock signal-wiring route in a semiconductor integrated circuit, without being limited to the signal-wiring path for clock propagation by e.g., the CTS wiring method.

Referring to FIG. 5, showing a semiconductor integrated circuit apparatus, when an input clock 3 (IN), fed from e.g., a clock driver, not shown, is fed through a changeover unit 10 to an input node A of a clock tree 4, a delay detection circuit for inputting the clock signal to its first input terminal resets or inactivates its output D (also termed a monitoring signal), with the delay circuit chain 11 then halting the propagation of the clock signals.

When the clocks fed to a node A of the clock tree 4 reaches the node B after the propagation delay time tCTS, the delay detection circuit 5. fed with the clock signals in its second input terminal, sets (activates) its output D and, responsive to this output D, the delay circuit chain 11 permits the clock propagation.

Figure 6:
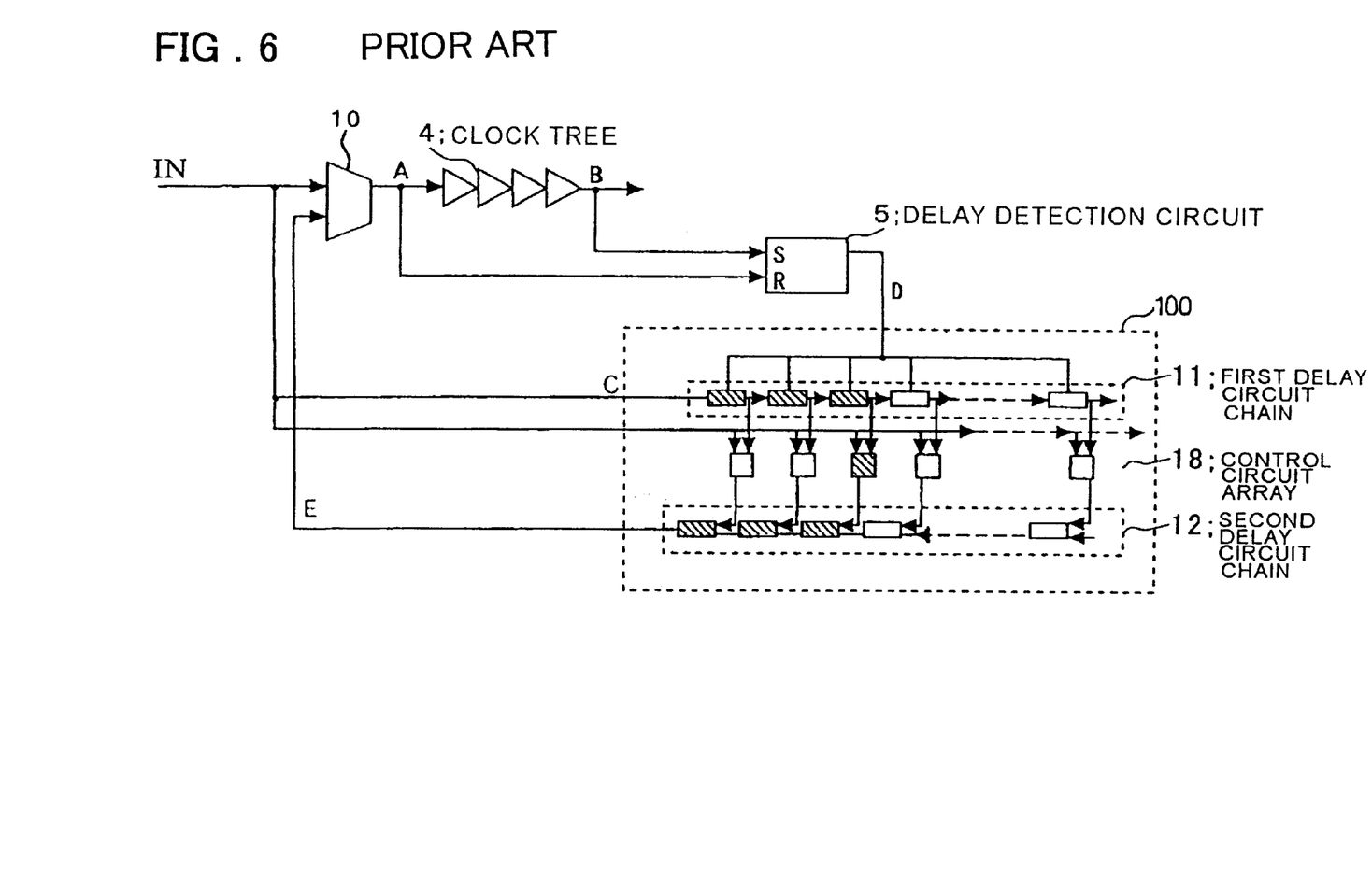
FIG. 6 shows a typical structure of a conventional synchronous delay circuit.

FIG. 6 shows an illustrative structure of a synchronous delay circuit 100 and the delay detection circuit 5 shown in FIG. 5. Referring to FIG. 6, the synchronous delay circuit 100 includes a first delay circuit chain 11 made up of plural unit delay elements, for transmitting pulses or pulse edges of input clocks (IN) and for issuing an output at an arbitrary position of the transmission path, a second delay circuit chain 12, similarly made up of plural unit delay devices, for being fed at an arbitrary position of the transmission path with clock Pulses and pulse edges for transmission, and a control circuit array 18, made up of plural control circuits, each having a signal input terminal, a signal output terminal and an input/output control terminal. The first and second delay circuit chains 11, 12 are designed so that the respective signal transmission paths are reversed in the signal propagation direction to each other. Moreover, the first delay circuit chain 11 and the second delay circuit chain 12 are interconnected through the control circuit array 18 so that the sides of the first delay circuit chain 11 closer to an input end of clocks IN are connected to the sides of the second delay circuit chain 12 closer to an output end of the clocks, and so that, at a time point when the clock signal input to the first delay circuit chain 11 has propagated a preset time as from the time point of inputting of the signal to the first delay circuit chain 11 that is at a time point when the next clock signal is input, a signal is input to the input/output control terminal of the control circuit array 18 at a position to which the clock signal has propagated so that the clock signal propagating through the first delay circuit chain 11 is input and transferred into the second delay circuit chain 12 from the Position corresponding to the propagated (traversed) position.

In the embodiment shown in FIG. 6, the delay circuit chain 11 for delay measurement and the delay circuit chain 12 for delay reproduction (reconstruction) are arranged in reverse directions to each other. Of course, the present invention is not limited to this configuration. A pair of delay circuit chains through which signal propagation occurs in the same direction may also form the synchronous delay circuit in the known manner. Reference may be had to the above-mentioned publications for alternative construct ions of the synchronous delay circuit, the entire disclosures thereof being incorporated in the present invention by reference thereto.

In the first delay circuit chain 11, in which a clock pulse has been input from the input end C, the clock pulse progresses through the inside of the first delay circuit chain 11 and, when a clock pulse next following the propagating clock pulse is input, the control circuit array 18 is activated responsive to this next clock pulse to transfer the clock pulse from the position in the first delay circuit chain 11 through which it is propagating through the control circuit array 18 registering with this position to the second delay circuit chain 12. The clock Pulse transferred to the second delay circuit chain 12 progresses through the second delay circuit chain 12 in a reverse direction to the propagating direction of the clock pulse through the first delay circuit chain 11 and is issued as output. In the embodiment shown in FIG. 6, a clock pulse progresses through the inside of the delay circuit chain 11 for delay measurement a number of delay circuits, shown by hatching, herein three delay circuits, in a given direction, herein in a direction of an arrow → and, responsive to the next clock input (IN), the clock pulse is transferred to the delay circuit chain 12 for delay reproduction (reconstruction), so as to propagate through three delay circuits of the delay circuit chain 12, shown by hatching, in the opposite direction indicated by an arrow ←. before it is issued as output.

The delay detection circuit 5 is formed as a set-reset (SR) flipflop or latch circuit having its reset (R) terminal and set (S) terminal connected to an input node A and to an output node B of the clock tree 4, respectively. When a clock pulse reaches the input node A of the clock tree 4, the delay detection circuit 5 is reset so that the control signal (monitor signal) goes Low. Similarly, when the clock pulse reaches the node B of the clock tree 4, the delay detection circuit 5 is set so that the control signal D goes High.

The operation of the conventional synchronous delay circuit, explained in connection with FIGS. 5 and 6, is now explained with reference to the timing diagram of FIGS. 7 and 8.

Figure 7:
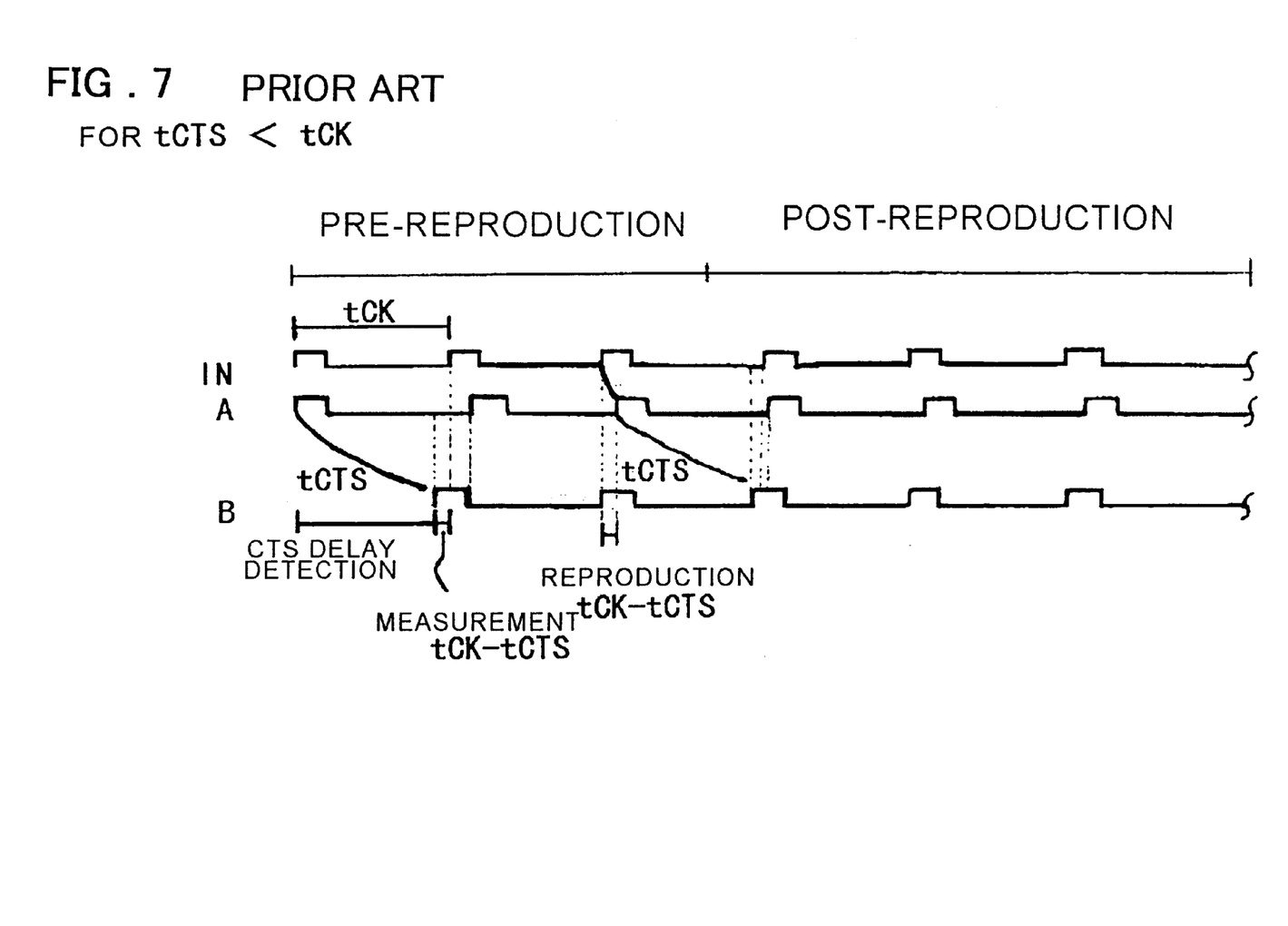
FIG. 7 is a timing diagram for illustrating the operation of a conventional synchronous delay circuit.

If the propagation delay time tCTS of the clock tree 4 is smaller than the clock period tCK (tCTS<tCK), a timing waveform as shown in FIG. 7 is obtained. In FIG. 7, IN, A and B denote an input clock 3, an input node A of the clock tree 4 and a clock signal waveform of the output node B, respectively.

First, the switching over unit 10 selects the clock 3 (IN) and, as from the time point the clock signal is input to the node A of the clock tree 4, the output of the delay detection circuit 5 is reset for a delay time tCTS of the clock tree 4, with the unit delay element (clocked inverter) in the first delay circuit chain 11 being turned off. At a time point after lapse of tCTS, when the clock signal reaches the node B of the clock tree 4, the output of the delay detection circuit 5 is set, with the clocked inverter forming the unit delay element in the first delay circuit chain 11 being turned on.

Referring to FIG. 7, the first clock of the input clocks IN progresses through the first delay circuit chain 11 for a time interval tCK−tCTS and, responsive to the second clock of the input clocks IN, the first clock is transferred through the control circuit 18 to the second delay circuit chain 12 as from a position (time point) corresponding to (tCK−tCTS). The first clock then progresses through the second delay circuit chain 12 for a reproduction time period of (tCK−tCTS) before it is issued as output. The output first clock is fed through the switching over unit 10 to the node A of the clock tree 4.

The rising edge of the clock input to the node A of the clock tree 4 is delayed from the input clock IN by the reproduction time (tCK−tCTS).

Figure 8:
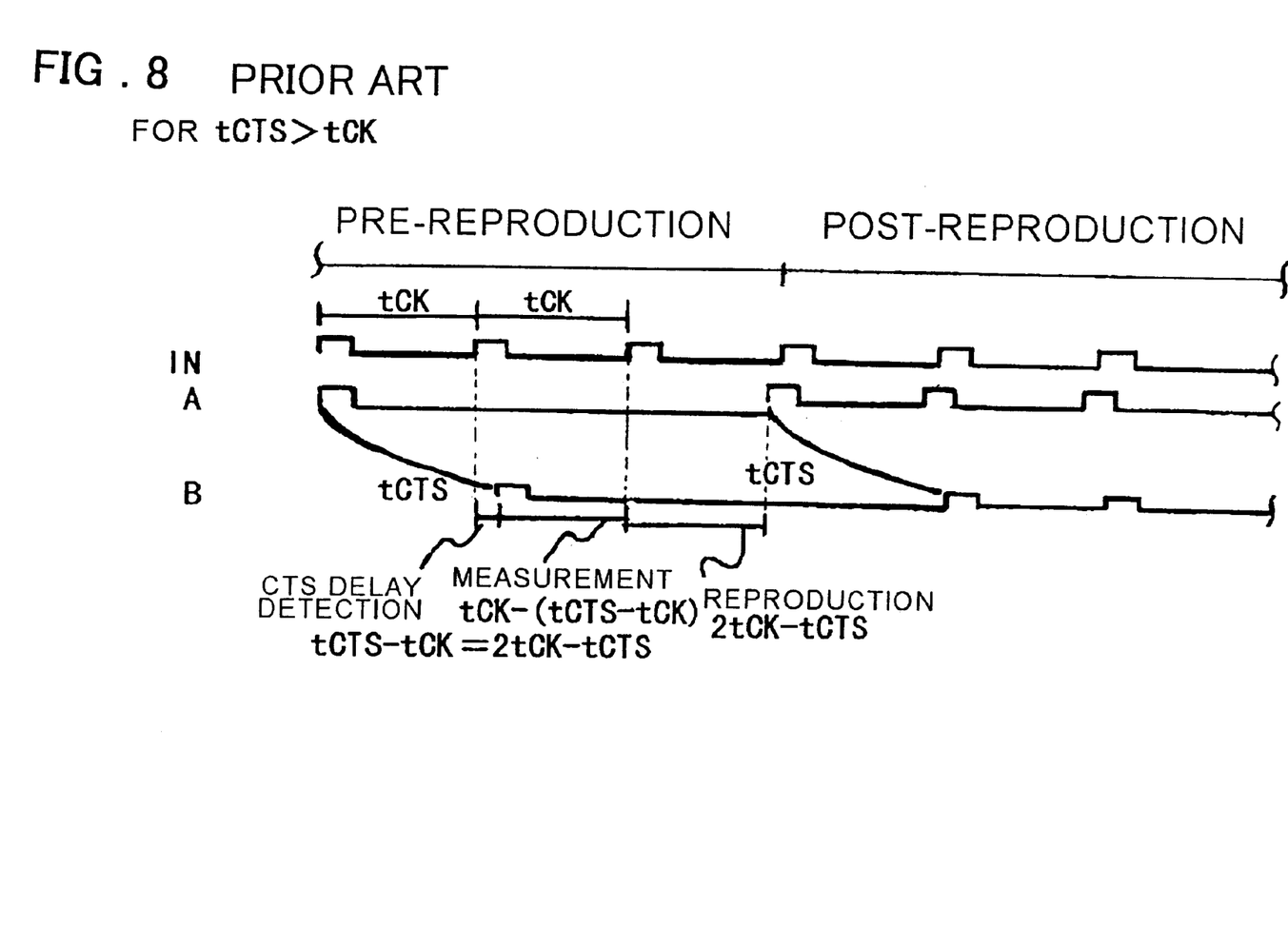
FIG. 8 is a timing diagram for illustrating the operation of the conventional synchronous delay circuit.

FIG. 8 illustrates the operation when the propagation delay time tCTS of the clock tree 4 is longer than the clock period tCK.

In this case, a clock reaches the node B after lapsing of the propagation delay time tCTS of the clock tree 4 as from the clock inputting time point to the node A of the clock tree 4. That is, until a time equal to one clock cycle tCK and further encroaching a time tCTS−tCK into the next clock cycle, the first delay circuit chain 11 is responsive to the output of the delay detection circuit 5 to stop (cease) the clock propagation. As from the time point of tCTS−tCK within the next clock cycle, the first delay circuit chain 11 begins propagating an input clock, specifically a second clock pulse of the input clock IN of FIG. 8. This second clock pulse progresses through the first delay circuit chain 11 of the synchronous delay circuit 100 until the next clock pulse, specifically a third clock pulse of the input clocks IN of FIG. 8, is input to the synchronous delay circuit 100.

That is, at a time Point when the clock (second clock pulse of the input clocks IN of FIG. 8) has Propagated through the first delay circuit chain 11 for a time interval of tCK−(tCTS−tCK)=2tCK−tCTS, the second pulse is transferred, from a position corresponding to the measured time 2tCK−tCTS in the first delay circuit chain 11, into the second delay circuit chain 12 for reproduction, responsive to the next clock pulse (third clock pulse of the input clocks IN of FIG. 8). The second clock pulse is transferred through the second delay circuit chain 12 for a reproduction time duration of 2tCK−tCTS so as to be output from the second delay circuit chain 12 and so as to be input to the node A of the clock tree 4 through the switching over unit 10 (second clock pulse shown at A in FIG. 8). Meanwhile, a third clock pulse at the node A in FIG. 8 is a clock signal corresponding to a second clock pulse of the input clocks IN of FIG. 8, that is, input to the first delay circuit chain 11, turned back at the measurement time, propagated for the reproduction time and output from the second delay circuit chain 12 to reach the node A of the clock tree 4.

After synchronization, clock signals are fed to the node A of the clock tree 4 at a timing (phase) which leads the rising edge of the input clock IN by a time interval of tCK−(2tCK−tCTS)=tCTS−tCK.

The synchronous delay circuit is basically made up of a circuit set comprised of a pair of delay circuit chains (or queues), as described above.

Figure 10:
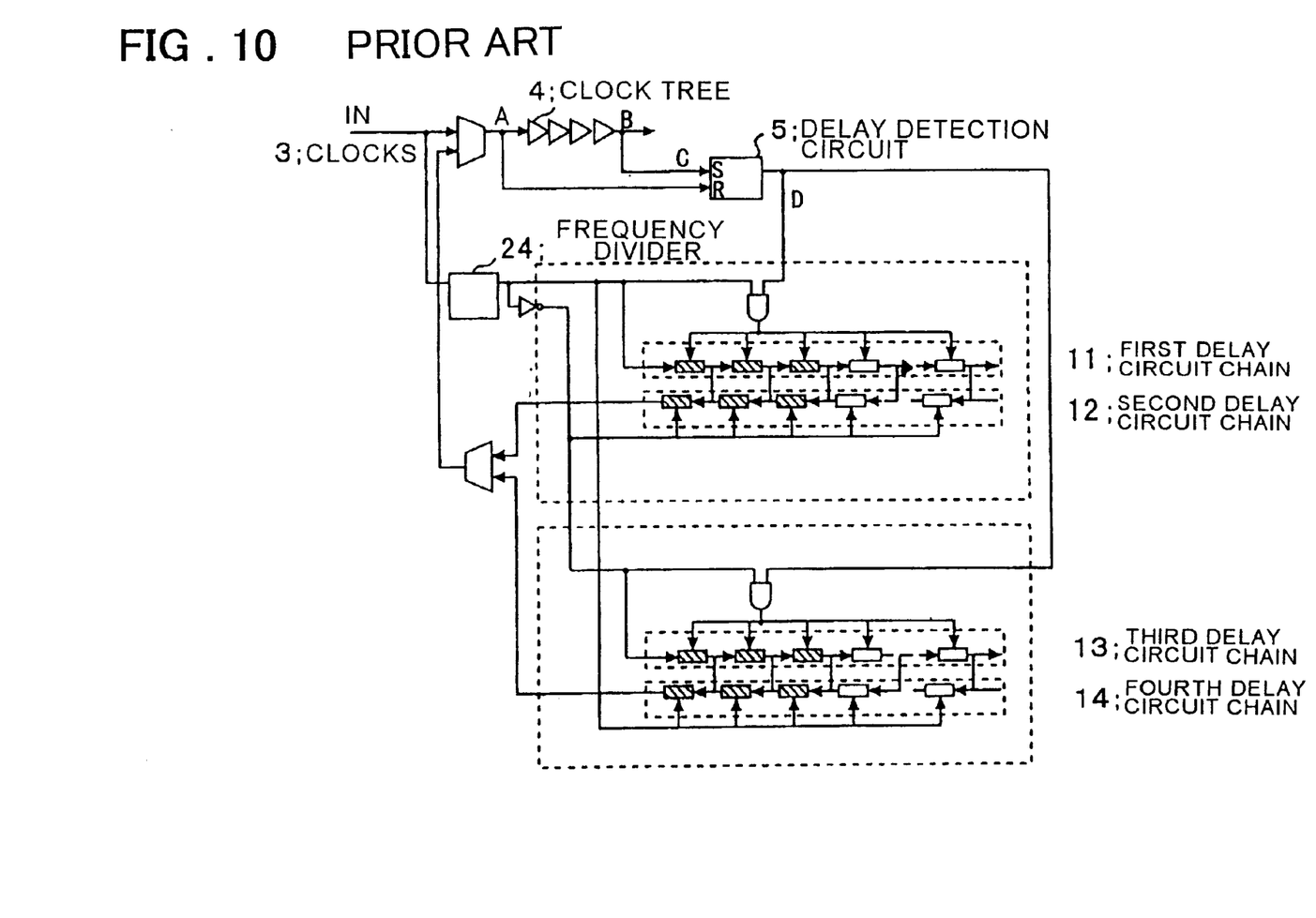
FIG. 10 shows another typical structure of the conventional synchronous delay circuit.

There is also known a configuration comprised of two sets of the synchronous delay circuits. In these two sets of the synchronous delay circuits, equal delay quantities are used as detected period quantities. As a structure comprised of two sets of the synchronous delay circuits, such a structure as disclosed e.g., in JP Patent Kokai JP-A-11-73238, and as shown herein for example in FIG. 10, is known. The circuit shown in FIG. 10 measures the clock periods using clock pulse edges. Specifically, the circuit shown in FIG. 10 includes two sets of delay circuit chains and frequency divides the clocks by a frequency divider 24 to run the delay circuit chains alternately, chain by chain, at an interval of one period.

SUMMARY OF THE DISCLOSURE

In the course of further researches toward the present invention, certain problems have been encountered.

Namely, the above-described conventional synchronous delay circuit has a drawback that the delay time tCTS of the clock tree 4 is set so as to be approximately equal to the clock period tCK, such that, if the clock period becomes longer or shorter than the delay of the clock tree due to, for example, jitter, the clocks are subjected to discontinuities in propagation.

The clock period tCK becomes shorter with an increasing operating frequency of a semiconductor integrated circuit, whilst the delay time tCTS of the clock tree 4 increases with increasing popularity of the clock using circuit, such that there will be an increasing number of occasions in future wherein the delay time tCTS of the clock tree 4 is approximately equal to the clock period tCK. It is therefore required to prevent erroneous circuit operation due to clock supply interrupt ions caused when the clock period fluctuates, i.e., becomes longer or shorter than the delay quantity of the clock tree. This will be elucidated in the following.

Figure 9:
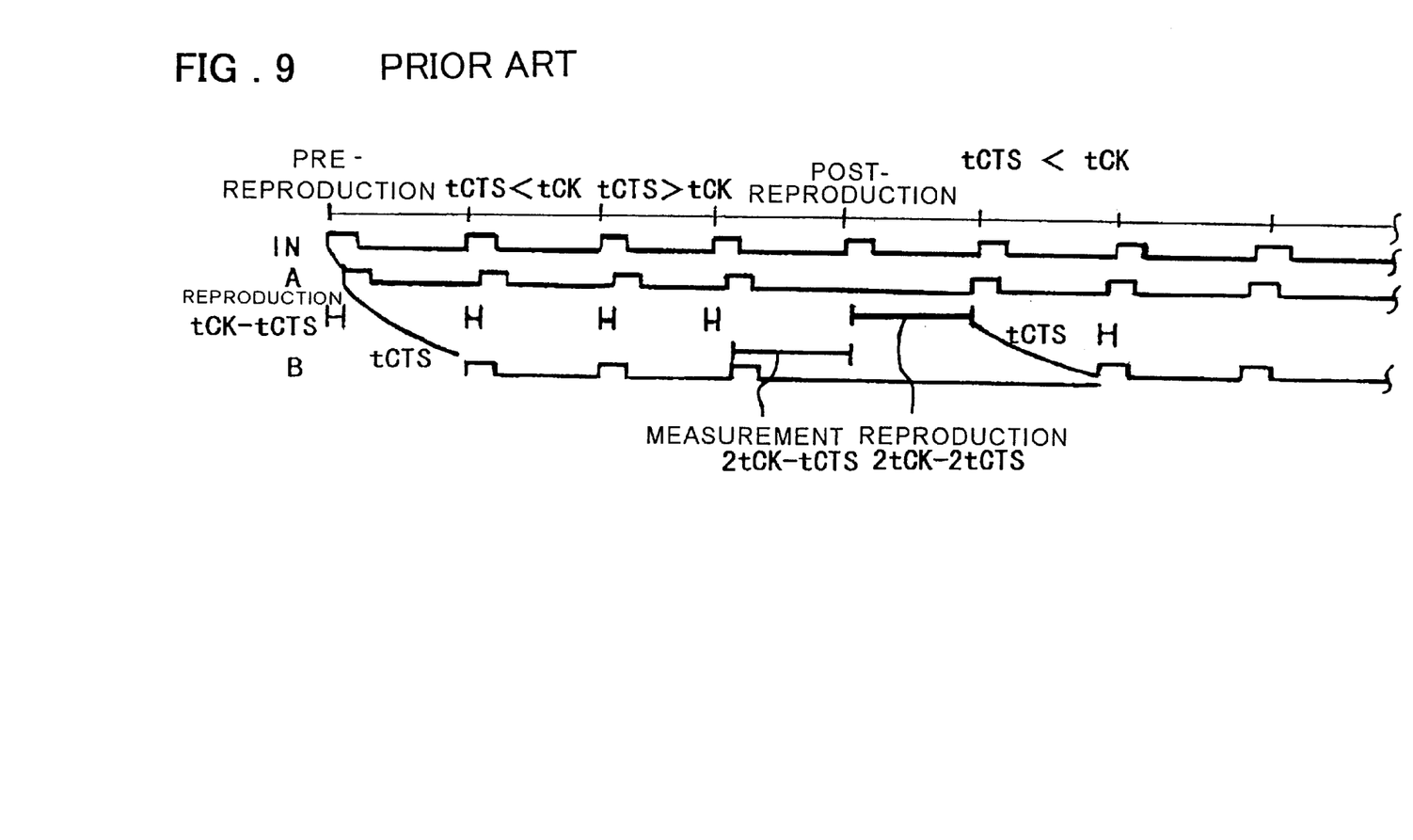
FIG. 9 is a timing diagram for illustrating the operation of the conventional synchronous delay circuit.

FIG. 9 illustrates the timing operation in a conventional synchronous delay circuit, explained e.g., with reference to FIG. 5, wherein the propagation delay time tCTS of the clock propagation path 4 is approximately equal to the clock period tCK of the input clock 3 (IN) and wherein such fluctuations as tCTS>tCK or tCTS≦tCK occur, e.g., following a synchronization.

If tCTS<tCK, as shown in FIG. 9, the node A of the clock propagation path 4 is fed with a clock rising with a delay equal to the reproducing time tCK−tCTS as from the rising edge of the clock input IN. If tCTS>tCK due, e.g., to jitter, the measuring time of the first delay circuit chain 11 (see FIG. 5) is 2tCK−tCTS, as stated previously. Thus, responsive to the clock signal fed to the first delay circuit chain 11, the clock is transferred from this position in the first delay circuit chain 11 to the second delay circuit chain 12 for reproduction, such that, after the reproducing (reconstructing) time of 2tCK−tCTS, the clock is issued as output from the second delay circuit chain 12 so as to be fed via switching over unit 10 to the node A of the clock propagation path 4.

In this case, clock supply interruptions (clock discontinuities) are produced at the input node A of the clock propagation path 4 fed with clocks from an output terminal of the synchronous delay circuit 100.

Should the clock supply interruptions (clock discontinuities) be produced in this manner, circuit malfunctions are produced in the synchronization circuit.

It is therefore a principal object of the present invent ion to provide a synchronous delay circuit in which, even if the clock period is approximately equal to the delay time of the clock propagation path, and if the clock tree delay time becomes longer or shorter than the clock period, due to, e.g., jitter or skew variations, it is reliably possible to prevent the clock discontinuities. Other aspects, objects, advantages and features of the present invention will be apparent from the following description of the present invention and the claims.

According to an aspect of the present invention, there is provided a synchronous delay circuit apparatus including a plurality of sets of synchronous delay circuits, each set including a first delay circuit chain for delay measurement, along which input clock signals propagate, and a second delay circuit chain, using the first delay circuit chain the difference being measured between the delay time of a preset circuit or path for propagating and outputting clocks and the period of input clocks, the second delay circuit chain reproducing and outputting the measured time difference. At least one of the sets of the synchronous delay circuits, being added with delay, has a measured delay quantity different from that of the other or others of the synchronous delay circuits, so that, even when the relative relation in the magnitudes between the delay time of the preset circuit or path and the Period of the input clock is changed, there is no discontinuity in clocks output from the synchronous delay circuits to the preset circuit or path.

According to a second aspect of the present invention, there is provided a synchronous delay circuit apparatus including a plurality of sets of synchronous delay circuits, each set including a first delay circuit chain for delay measurement, along which input clock signals propagate, and a second delay circuit chain for period reproduction for allowing the clock signals to pass therethrough a length corresponding to the length of propagation of the clock signals through the first delay circuit chain, and delay detection circuits each associated with each of the synchronous delay circuits. The delay detection circuit detects the propagation delay time required for propagating clocks from an input node to a preset output node of a preset clock propagation path, the delay detection circuit outputting a control signal for controlling the synchronous delay circuit to halt the propagation of clock signals in association with the propagation delay time.

There is introduced delay to an input of at least one of the Plural delay detection circuits to differentiate the delay time as detected in the one delay detection circuit from the delay time detected by the other delay detection circuits to differentiate the detected period quantity in the synchronous delay circuit associated with the one delay detection circuit from the detected period quantity detected in the synchronous delay circuit associated with each of the other delay detection circuits, so that, even if the propagation delay time in the clock propagation path becomes longer or shorter than the clock period, no discontinuity is produced in the clocks supplied from the synchronous delay circuit to the clock propagation Path.

According to a third aspect, there is provided a synchronous delay circuit apparatus comprising:

(a) two sets of synchronous delay circuits, each set including a first delay circuit chain for period measurement for propagation of pulses or pulse edges of input clock signals and a second delay circuit chain for period reproduction, the second delay circuit chain allowing pulses or pulse edges of clock signals to propagate therethrough by a length corresponding to the length traversed by the pulses or pulse edges of the clock signals through the first delay circuit chain; and (b) two delay detection circuits provided in association with the synchronous delay circuits, respectively, each delay detection circuit detecting the propagation delay time in propagating the clocks from the input node to a preset output node of a clock propagation path and outputting a control signal for controlling the synchronous delay circuit to cease the propagation of the pulses or pulse edges of input clock signals in association with the propagation delay time;

(c) wherein delay is introduced to an input of at least one of the plural delay detection circuits to differentiate the delay time as detected in the one delay detection circuit from the delay time detected by the other of the delay detection circuits to differentiate the period in the synchronous delay circuit associated with the one delay detection circuit from the detected period quantity detected in the synchronous delay circuit associated with each of the the other of the delay detection circuits, so that, even when the propagation delay time in the clock propagation path becomes longer or shorter than the clock period, no discontinuity is produced in the clocks supplied from the synchronous delay circuit to the clock propagation path.

There is provided a switching over unit for switching over between an output of each second delay circuit chain of each synchronous delay circuit, and an output of the switching over unit is connected to an input node of the clock propagation path.

The delay detection circuit comprises a flipflop that is reset responsive to clock inputting to an input node of the clock propagation path and set responsive to an output of the clock from an output node of the clock propagation path.

According to a fourth aspect, there is provided a semiconductor integrated circuit apparatus in which a clock signal supplied to a clock propagation path is control led using a synchronous delay circuit, the semiconductor integrated circuit comprising:

(a) a plurality of sets of synchronous delay circuits, each set including a first delay circuit chain for period measurement, along which input clock signals propagate, and a second delay circuit chain, for period reproduction, allowing the clock signals to pass therethrough a length corresponding to the length of propagation of the clock signals through the first delay circuit chain; and (b) delay detection circuits each associated with each of the synchronous delay circuit, the delay detection circuits each detecting the propagation delay time required for propagating clocks from an input node to a preset output node of a preset clock propagation path, the delay detection circuits each outputting a control signal for controlling the synchronous delay circuit to cease the propagation of clock signals in association with the propagation delay time;

(c) wherein delay (td) is introduced to an input of at least one of the plural delay detection circuits to differentiate a delay time as detected in the one delay detect ion circuit from a delay time detected by the other delay detection circuits, to differentiate a detected period quantity in the synchronous delay circuit associated with the one delay detection circuit from a detected period quantity detected in the synchronous delay circuit associated with each of the other delay detection circuits, so that, even if the relative relation in the magnitudes of the Propagation delay time (tCTS) of the clock propagation path and the clock period (tCK) of the input clocks is changed to cause discontinuity in clocks from a given one of the sets of the synchronous delay circuits, clocks synchronized with the input clocks are output from the other of the sets of the synchronous delay circuits and routed to the clock propagation path.

According to a fifth aspect, there is provided a semiconductor integrated circuit apparatus for controlling clock signals supplied to a clock propagation path using a synchronous delay circuit, comprising:

(a) a first synchronous delay circuit including a first delay circuit chain for period measurement, that allows propagation of input clock signals and a second delay circuit chain for period reproduction, the second delay circuit chain allowing the clock signals to propagate therethrough by a length corresponding to the length traversed by the clock signals through the first delay circuit chain; and (b) a first delay detection circuit for detecting the propagation delay time (tCTS) in propagating the clocks from an input node to a preset output node of a clock propagation path and outputting a control signal for controlling the first synchronous delay circuit to cease the propagation of the clock signals for a period of time corresponding to the propagation delay time;

(c) a second synchronous delay circuit including a third delay circuit chain, for period measurement, that allows propagation of input clock signals and a fourth delay circuit chain for period reproduction, the fourth delay circuit chain allowing the clock signals to propagate therethrough by a length corresponding to the length traversed by the clock signals through the third delay circuit chain; and (d) a second delay detection circuit for detecting the propagation delay time (tCTS) in propagating the clocks from the input node to a preset output node of a clock propagation path and outputting a second control signal for controlling the second synchronous delay circuit to cease the propagation of the clock signals for a period of time corresponding to the propagation delay time;

(e) wherein outputs of the second and fourth delay circuit chains are fed to the input node of the clock propagation path through a switching over unit.

A first delay circuit having a fixed delay time is provided between an output node in the clock propagation path and an input terminal of the second delay detection circuit, and a second delay circuit having the fixed delay time is inserted between an output of the fourth delay circuit chain and an input terminal of the switching over unit.

Delay circuit elements forming the first delay circuit chain comprise clocked inverters on-off controlled by the control signal.

The first and second delay detection circuits are flip-flops being reset and set by an input clock to the clock propagation path and an output clock from the clock propagation path.

A first delay circuit having a fixed delay time is provided between an output node in the clock propagation path and an input terminal of the second delay detection circuit, and a second delay circuit having the fixed delay time is inserted between an output of the fourth delay circuit chain and an input terminal of the switching over unit.

PREFERRED EMBODIMENTS OF THE INVENTION

Figure 1:
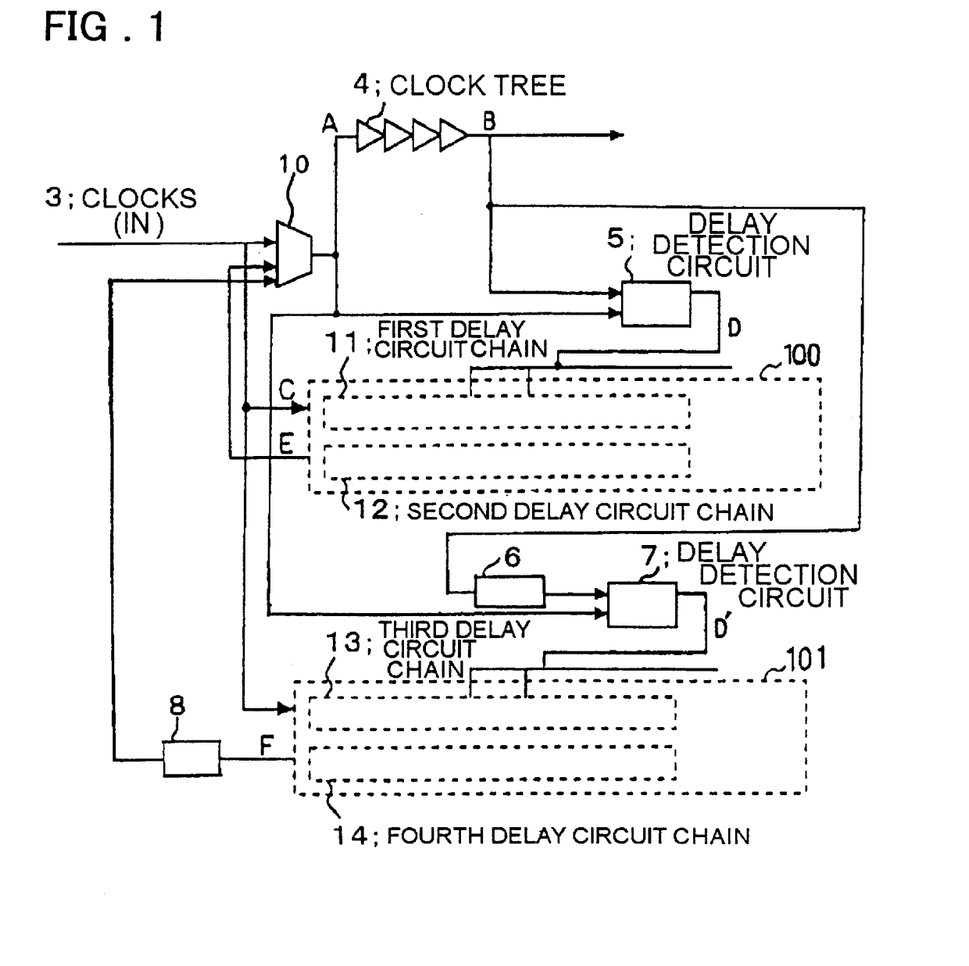
FIG. 1 shows a structure of an embodiment of the present invention.

Referring to FIG. 1, the preferred embodiment of the clock control circuit according to the present invention includes a first synchronous delay circuit 100, made up of a first delay detection circuit 5 for measuring the period (delay), outputting a control signal D as from a time point of inputting a clock to an input node A of a preset clock propagation path 4 until a time point of outputting the clock from a given node B of a clock propagation path 4, a first delay circuit chain 11 for allowing propagation of clock signals therethrough, and a second delay circuit chain 12 for period (delay) reproduction, fed with the clock signals which have propagated through the first delay circuit chain 11 and which allow the input clock signals to propagate therethrough a length corresponding to the length the clock signals have traversed the first delay circuit chain. The propagation of the clock signals is ceased in the first delay circuit chain 11 by the control signal D output from the first delay detection circuit 5. The preferred embodiment of the clock control circuit according to the present invention also includes a second synchronous delay circuit 101, made up of a second delay detection circuit 7 for outputting a control signal D' during the time corresponding to the propagation delay time as from the time point of inputting of the clock to the input node A of the clock propagation path 4 until a time point of outputting of the clock from the node B of the clock propagation path plus the delay time caused in the delay circuit 6, a third delay circuit chain 13 for allowing propagation of clock signals therethrough, and a fourth delay circuit chain 14 for period (delay) reproduction, fed with the clock signals which have propagated through the third delay circuit chain 11 and which allow the input clock signals to propagate therethrough a length corresponding to the length the clock signals have traversed the third delay circuit chain. The propagation of the clock signals is ceased in the third delay circuit chain 13 by the control signal D' output from the second delay detection circuit 7. The preferred embodiment of the clock control circuit according to the present invention also includes a switching over unit 10 for switching over between the output of the second and fourth delay circuit chains 12, 14 and the input clock 3, with an output of the switching over unit 10 being connected to the input node A of the clock propagation path 4. A delay circuit 8 with a preset delay time is inserted between an output terminal of the fourth delay circuit chain 14 and the switching over unit 10.

In a preferred embodiment of the present invention, the first and second delay detection circuits 5, 7 may each be designed as a set/reset (SR) flipflop reset and set by an input clock to the clock Propagation path 4 and by an output clock from the clock propagation path, respectively.

In a preferred embodiment of the present invention, a delay detection quantity of the second delay detection circuit 7 is differentiated from a delay detection quantity of the first delay detection circuit 5 (=propagation delay time in the clock propagation path) to differentiate the period detection quantities in the synchronous delay circuits 100, 101, that is delay quantities measured in the delay circuit chains for measurement, from each other, such that, even if the propagation delay time (tCTS) of the clock propagation path 4 becomes longer or shorter than the clock period (tCK) of the input clocks, there are produced no discontinuities in the clocks supplied from the synchronous delay circuits 100, 101 to the clock propagation path 4.

For more detailed explanation of the aforementioned preferred embodiments of the present invention, an embodiment of the present invention is hereinafter explained. Referring to FIG. 1, a configuration of the embodiment of the present invention, shown therein, includes a synchronous delay circuit 100, comprised of a first delay circuit chain 11 for period measurement, through which propagate pulses or pulse edges of clock signals, and a second delay circuit chain 12 for a period of reproduction, through which the pulses or pulse edges of clock signals are allowed to propagate a length corresponding to the length of travel of the pulses or Pulse edges of clock signals in the first delay circuit chain 11. The configuration of the embodiment of the present invention, shown in FIG. 1, also includes a synchronous delay circuit 101, comprised of a third delay circuit chain 13 for period measurement, through which propagate pulses or pulse edges of clock signals, and a fourth delay circuit chain 14 for period reproduction, through which the pulses or pulse edges of clock signals are allowed to propagate a length corresponding to the length of travel of the pulses or pulse edges of clock signals in the third delay circuit chain 13. The configuration of the embodiment of the present invention. shown in FIG. 1, additionally includes delay detection circuits 5, 7, in association with these two sets of the synchronous delay circuits 100, 101, for halting the propagation of the pulses or pulse edges through the first and third delay circuit chains 11, 13 for a time corresponding to the delay time caused in propagation of the clocks through the clock tree 4.

Between the output node B of the clock tree 4 and the delay detection circuit 7, there is inserted a delay circuit 6 with a fixed delay time td, such that the delay time as detected by the delay detection circuit 7 is equal to the propagation delay time tCTS of the clock tree 4 plus the delay time td of the delay detection circuit 6. with the control signal D', also termed a monitor signal, being of a Low level during the time tCTS+td.

At a time Point when the propagation delay time tCTS of the clock tree 4 is longer than the clock period tCK (change time point), if clock supply interruption occurs in an output of the synchronous delay circuit 100, as shown in FIG. 9, clocks are constantly output from the synchronous delay circuit 101 so as to be fed to the input node A of the clock tree 4 to prevent clock supply interruptions (non-continuous points) from being produced in the clocks supplied to the input node A of the clock tree 4.

An output of the fourth delay circuit chain 14 of the synchronous delay circuit 101 is fed via a delay circuit 8 with a fixed delay time (=td) to the switching over unit 10 so that one of input clock 3 and output clocks of the synchronous delay circuits 100, 101 is routed via the switching over unit 10 to the input node A of the clock tree 4.

In an embodiment of the present invention, the delay detection circuit 5 and the synchronous delay circuit 100 may be realized by the same circuit configuration as the conventional circuit configuration explained with reference to FIGS. 5 and 6. The delay detect ion circuit 7 and the synchronous delay circuit 101 are of the same configuration as that of the delay detection circuit 5 and the synchronous delay circuit 100, respectively.

Figure 2A:
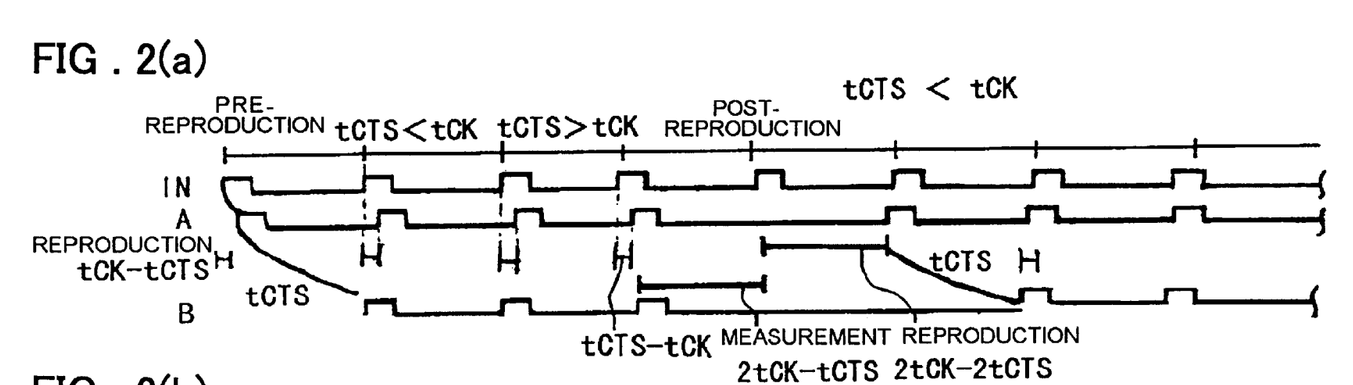
FIG. 2 is a timing chart showing a structure of a synchronous delay circuit embodying the present invention.
Figure 2B:
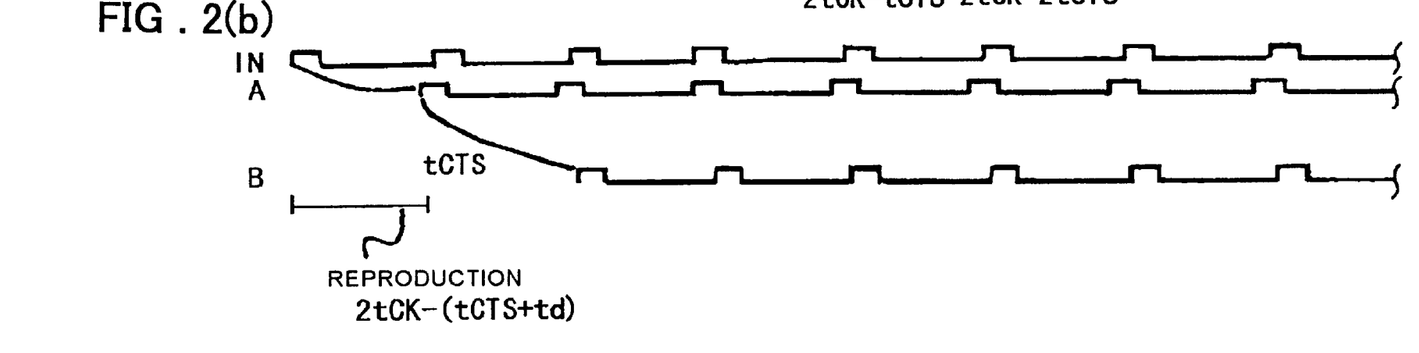

FIG. 2 illustrates the timing in case that, in an embodiment of the present invention, the delay time tCTS of the clock tree 4 is approximately equal to the clock period tCK of the input clock, with the timing being changed to tCTS>tCK or tCTS≦tCK following synchronization, e.g., due to jitter.

Referring to FIG. 2, if tCTS<tCK, a clock is output from the synchronous delay circuit 100 with a delay of a preset time period tCK–tCTS as from the rising edge of the input clock IN, while a clock is output from the synchronous delay circuit 101 with a delay of 2tCK–(tCTS+td)+td as from the rising edge of the input clock IN.

If, due to jitter, the relation is changed to tCTS>tCK, the measured time in the first delay circuit chain 11 of the synchronous delay circuit 100 is 2tCK–tCTS, a propagating clock in the first delay circuit chain 11 is responsive to a clock signal input to the synchronous delay circuit 100 to be transferred through the control circuit 18 to the second delay circuit chain 12 for delay reproduction after the reproduction time 2tCK–tCTS, so as to be output from the second delay circuit chain 12 for delay reproduction. In this case, the output of the synchronous delay circuit 100 suffers from clock supply interruptions (discontinuities in the clock supply).

In this case, clocks are output from the delay circuit chain 13 in the synchronous delay circuit 101 with a delay equal to reproduction time 2tCK–(tCTS+td) as from the rising edge of the input clock 3, as explained with reference to FIG. 7, by the delay detection circuit 7 with the delay time td, thus producing no clock supply interruptions. It is assumed here that td is such that tCTS+td>tCK.

The clock F output from the fourth delay circuit chain 14 of the synchronous delay circuit 101 is delayed by the delay circuit 8 (delay time: td), so that clocks from the synchronous delay circuit 101 are sent to the input node A of the clock tree 4 with a delay time equal to the sum of the reproduction time 2tCK–(tCTS+td) and the delay time td, that is with a delay time equal to 2tCK–tCTS.

For shortening the detected period quantity (length) on the side synchronous delay circuit 101 for differentiating it from the detected period by the synchronous delay circuit 100, the delay circuit 8 sends a clock. rising at a timing 2tCK–tCTS, through the switching over unit 10 to the input node A of the clock tree 4. The timing 2tCK–tCTS is obtained on subtracting the delay time td from the reproduction time of 2tCK–(tCTS+td) increased by the delay time td of the delay circuit 6 inserted into the input of the delay detection circuit 7. The delay circuit 8 may be omitted in an application circuit, if such delay circuit is unnecessary.

If, in a case of tCTS>tCK, the timing is changed to tCTS<tCK or tCTS>tCK, due to, e.g., jitter, discontinuities in the clock supply are produced in the output clocks of the synchronous delay circuit 100, by the same principle as described above. However, clocks synchronized to the input clock 3 are again Produced from the synchronous delay circuit 101 at a time point when the timing has been changed to tCTS+td>tCK due, e.g., to jitter, and are supplied through the switching over unit 10 to the input node A of the clock tree 4.

The timing may also be such that tCTS+td<tCK. In this case, interruptions in supply of output clocks of the synchronous delay circuit 101 are produced at a time point when the timing is changed to tCTS+td>tCK due, e.g., to jitter.

In this case, clocks synchronized with the input clocks 3 are output from the synchronous delay circuit 100 so as to be supplied through the switching over unit 10 to the input node A of the clock tree 4.

Thus, according to the Present preferred embodiment of the present invention, if, with tCTS approximately equal to tCK, clocks from one of the synchronous delay circuits become interrupted and discontinuous at a time point the timing has been changed from tCTS>tCK to tCTS<tCK, clocks are output from the other synchronous delay circuit(s) different from the first stated synchronous delay circuit in the period detection quantity, so that there is no risk of interruption of clocks supplied from the synchronous delay circuits.

Figure 3:
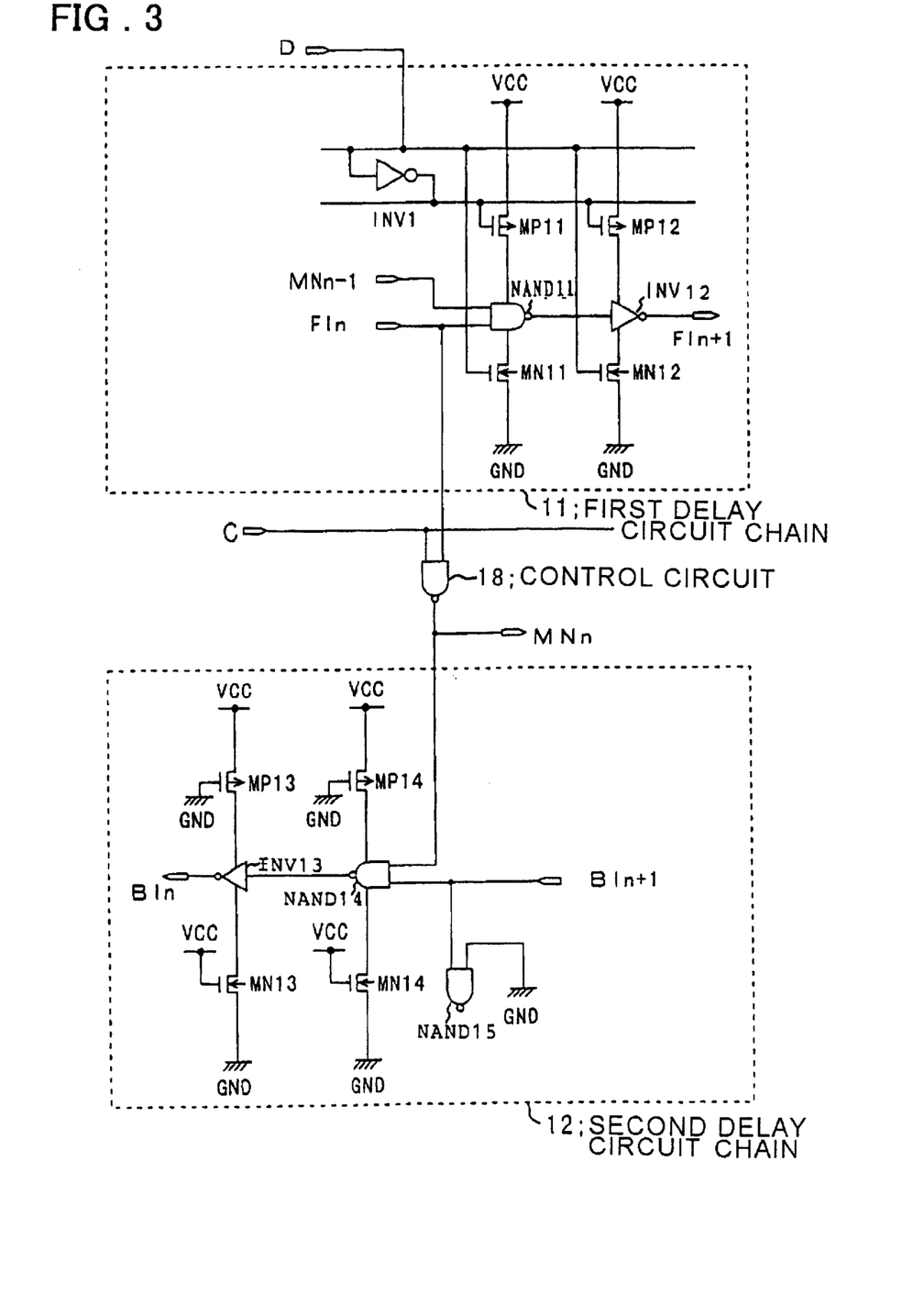
FIG. 3 illustrates a structure of a synchronous delay circuit embodying the present invention.

FIG. 3 shows an illustrative structure of the first delay circuit chain 11 (third delay circuit chain 13), control circuit 18, and the second delay circuit chain 12 (fourth delay circuit chain 14). The unit delay element of the delay circuit chain is a clocked inverter. The time a clock pulse traverses the clock tree 4 is selected so that a control signal D generated in the delay detection circuits 5, 7 responsive to the clock which has reached the input node A of the clock tree 4 goes Low to turn off MOS transistors MN11, MN12, MP11 and MP12 of the delay circuit chain 11 (13) to prevent the clock pulse from propagating through the delay circuit chain 11 (13).

That is, when an input pulse is fed to the node A of the clock tree 4, the delay detection circuit 5 (7), comprised of a set/reset (S/R) flip-flop is reset so that the signal D (D') goes Low. When the edge of the clock[3] pulse reaches the node B, the SR flipflop of the delay detection circuit 5 is set so that the signal D (D') goes High to turn ON the MOS transistors MN11, MN12, MP11 and MP12 of the delay circuit chain 11 (13). It is noted that the S/R flipflop is set after a further delay time td in the delay detection circuit 7.

During the time the clock pulse or edge traverses the clock tree 4. the signal D goes Low to turn the clocked inverters of the delay circuit chain 11 off to stop clock propagation. On the other hand, the signal D' goes Low during the time the clock pulse or edge traverses the clock tree 4 (tCTS) plus the delay time td of the delay circuit 6 to turn off the clocked inverters of the delay circuit chain 13 to stop clock propagation.

The clocked inverters of the delay circuit chains 12 (14) are designed to provide for equal delay time of the delay circuit chains 12 (14) with that of the delay circuit chains 11 (13), and are in the normally ON state. That is, MOS transistors MN13, MN14, MP13 and MP14 are in the normally ON state.

Referring to FIG. 3, the nth unit delay element is explained. An output Fln of a (n−1) st inverter of the delay circuit chain 11 is fed to a NAND gate (NAND 11) and to one of two input terminals of the NAND gate of the control circuit 18 which is not connected to a control terminal C connected in turn to an input terminal IN of the input clocks. An output MNn of the NAND gate of the control circuit 18 is connected to one of two input terminals of the (n+1) st NAND gate, not shown, of the delay circuit chain 11 which is not connected to an output Fln+1 of the n' th inverter INV12. The output MNn is also connected to one of two input terminals of the NAND gate (NAND 14) of the delay circuit chain 12, which one is not connected to an output Bln+1 of the upstream side inverter. An output of the NAND gate (NAND 14) of the delay circuit chain 12 is connected to an input of an inverter INV 13 of the delay circuit chain 12, which input is not connected to an output Bln+1 of an upstream side inverter. The output Bln+1 of an upstream side inverter of the NAND gate (NAND 14) of the delay circuit chain 12 is fed to the NAND gate (NAND 14), while being connected to one of two input terminals of the NAND gate (NAND gate 15), which one is not connected to a grounding terminal. The NAND gate (NAND gate 15) operates as a load adjustment element. Meanwhile, an output of the NAND 15 as the load adjustment element remains unconnected. The configuration of the third and fourth delay circuit chains 13, 14 is similar to that of the first and second delay circuit chains 11, 12.

Thus, according to the present invention, the period detection quantities in the synchronous delay circuits 100, 101 are differentiated from each other to prevent clock supply interruptions Produced due to timing change from tCTS<tCK to tCTS>tCK or vice versa. The delay circuit 6 may be inserted between the n ode A of the clock tree 4 and the input end (reset terminal R) of the delay detection circuit 7, as shown for example in FIG. 4.

Figure 4:
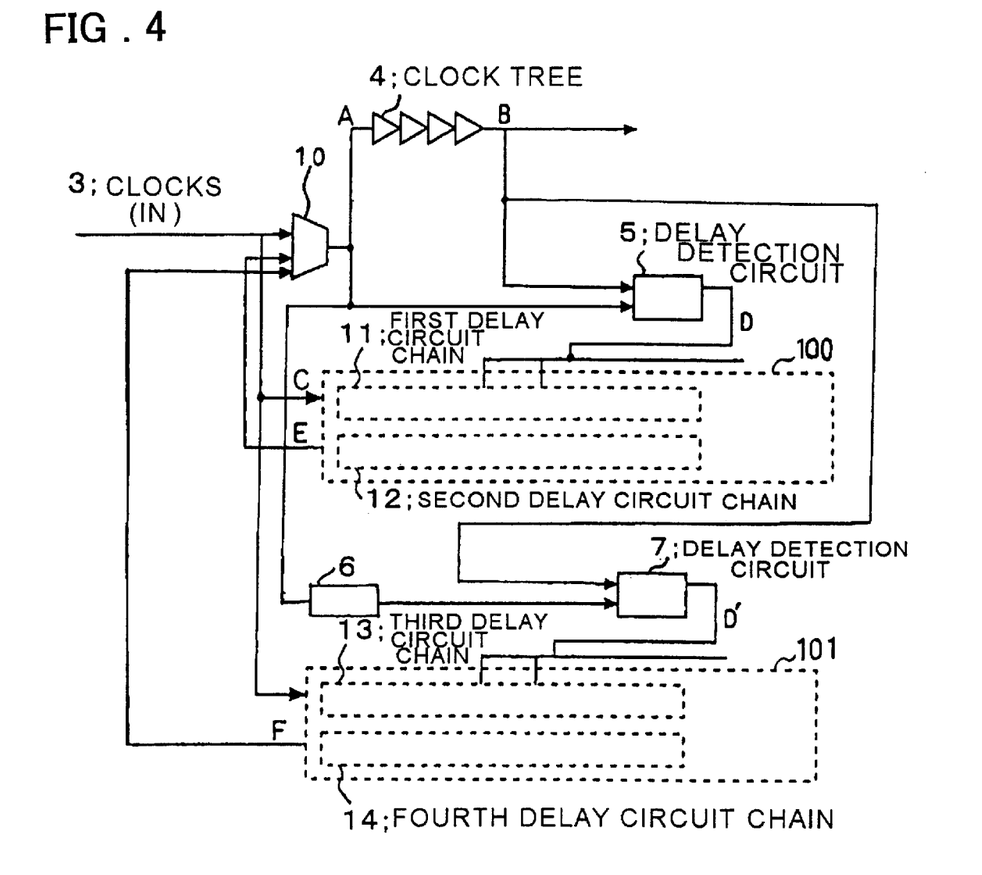
FIG. 4 illustrates a modification of an embodiment of the present invention.

If, in the configuration shown in FIG. 4, tCTS<tCK, the synchronous delay circuit 100 outputs a clock with a preset time delay of tCK−tCTS as from the rising edge of the input clock 3 (IN), as in the aforementioned embodiment. The delay detection circuit 7 sets the control signal (monitor) D' to a Low level with a delay time td as from the time point the clock is input to the node A of the clock tree 4. while setting the control signal (monitor) D' to a Low level during the time of tCTS−td, that is until the clock reaches the node B of the clock tree 4, to halt the propagation of clocks through the third delay circuit chain 13. So, the measurement delay quantity of the third delay circuit chain 13 is tCK−(tCTS−td), while the reproduction delay quantity of the fourth delay circuit chain 14 is tCK−(tCTS−td), so that the clock is routed to the input node A of the clock tree 4 with a delay of tCK−(tCTS−td)=tCK−tCTS+td as from the rising edge of the input clock 3.

Even if, as a result of timing change to tCTS>tCK due e.g., to jitter, as from the state of tCTS<tCK, the clocks supplied from the synchronous delay circuit 100 undergo supply interruption, a clock F is output from the synchronous delay circuit 101 with a delay of tCK−tCTS+td as from the rising edge of the input clock 3, so that there is Produced no supply interruption of clocks (discontinuities in clock supply) to the input node A of the clock tree 4.

Although the configuration described above is provided with two sets of the synchronous delay circuits. However, it should be noted that, according to the present invention, the number of sets of the synchronous delay circuits is not limited to two. For example, such a configuration may be used in which three or more synchronous delay circuits are provided, delay detection Circuits are provided in association with the respective synchronous delay circuits and a delay element is provided in the delay detection circuit to provide for a differential period detection quantity in association with each synchronous delay circuit.

According to the present invention, the synchronous delay circuit is not limited to a configuration of a pair of delay circuit chains having opposite clock propagating directions. That is, the present invention can naturally be applied to the configuration of a pair of delay circuit chains having the same clock propagating direction (see JP Patent Kokai JP-A-11-73238, the disclosure thereof being herein incorporated by reference thereto).

The meritorious effects of the Present invent ion are summarized as follows.

According to the present invention as described above, plural sets of synchronous delay circuits are provided and the period detection quantities in the respective delay circuit chains are differentiated from one another, so that, even when the propagation delay time of the clock propagation path adapted for detecting the delay time is changed in its relative relation in the magnitudes as compared to the clock period such that output clock interruption is produced from one of the synchronous delay circuits, the other synchronous delay circuit outputs clocks in synchronism with the input clock, so that it is possible to prevent occurrence of discontinuities in the clocks supplied from the synchronous delay circuit to the clock propagation path. According to the Present invention, it is possible with advantage to assure reliable clock control operations in a semiconductor integrated circuit with an increasing operating frequency and circuit scale.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A synchronous delay circuit apparatus comprising:
   (a) a plurality of sets of synchronous delay circuits, each set including a first delay circuit chain for delay measurement, along which input clock signals propagate, and a second delay circuit chain, connected to said first delay circuit chain, a difference being measured by said first delay circuit chain, said difference being between the delay time of a preset circuit or path for propagating and outputting clocks and the period of input clocks, said second delay circuit chain reproducing and outputting the measured time difference;
   (b) wherein at least one of said sets of the synchronous delay circuits, in combination with at least one delay circuit, has a measured delay quantity different from that of the other or others of the synchronous delay circuits, without causing discontinuity in clocks output from said synchronous delay circuits to said preset circuit or path even when the relative relation in the magnitudes between the delay time of the preset circuit or path and the period of said input clock is changed.

2. A synchronous delay circuit apparatus comprising:
   (a) a plurality of sets of synchronous delay circuits, each set including a first delay circuit chain for delay measurement, along which input clock signals propagate, and a second delay circuit chain for allowing the input clock signals to propagate through a length corresponding to a length of propagation of the input clock signals through said first delay circuit chain; and
   (b) delay detection circuits each controlling operation of one said first delay circuit chain, said delay detection circuits each detecting a propagation delay time required for propagating clock signals from an input node to a preset output node of a preset clock propagation path, each said delay detection circuit outputting a control signal for controlling said one first delay circuit chain to halt the propagation of the input clock signals based upon, at least in part, said propagation delay time;
   (c) wherein delay is introduced by at least one delay circuit to an input of at least one of said delay detection circuits to differentiate at least one delay time as detected in said at least one of said delay detection circuits from delay times detected by the other delay detection circuits to differentiate at least one detected period quantity detected in the at least one first delay circuit chain controlled by said at least one of said delay detection circuits from a detected period quantity detected in each said first delay circuit chain controlled by each of said other delay detection circuits, so that, even when the propagation delay time in said preset clock propagation path becomes longer or shorter than a clock period of the input clock signals, no discontinuity is produced in clock signals supplied from one of said sets of synchronous delay circuits to said clock propagation path.

3. A synchronous delay circuit apparatus comprising:
(a) two sets of synchronous delay circuits, each set including a first delay circuit chain for period measurement for propagation of pulses or pulse edges of input clock signals and a second delay circuit chain, said second delay circuit chain allowing pulses or pulse edges of said input clock signals to propagate through a length corresponding to a length traversed by said pulses or pulse edges of said input clock signals through said first delay circuit chain; and
(b) two delay detection circuits each controlling operation of one said first delay circuit chain, each delay detection circuit detecting a propagation delay time in propagating clock signals from an input node to a preset output node of a preset clock propagation path and outputting a control signal for controlling said one first delay circuit chain to cease the propagation of the pulses or pulse edges of the input clock signals based upon, at least in part, said propagation delay time;
(c) wherein delay is introduced by at least one delay circuit to an input of at least one of said delay detection circuits to differentiate a delay time as detected in one of said delay detection circuits from a delay time detected by the other of the delay detection circuits to differentiate a detected period quantity detected in one said first delay circuit chain controlled by said one of said delay detection circuits from a detected period quantity detected in another said first delay circuit chain controlled by said other of the delay detection circuits, so that, even when the propagation delay time in said preset clock propagation path becomes longer or shorter than a clock period of the input clock signals, no discontinuity is produced in clock signals supplied from one of said sets of synchronous delay circuits to said clock propagation path.

4. The synchronous delay circuit as defined in claim 2 wherein delay circuit elements forming said first delay circuit chain are clocked inverters on-off control led by said control signal.

5. The synchronous delay circuit as defined in claim 3 wherein delay circuit elements forming said first delay circuit chain a are clocked inverters on-off controlled by said control signal.

6. The synchronous delay circuit as defined in claim 2 wherein there is provided a switching over unit for switching over between an output of each second delay circuit chain of each synchronous delay circuit, and said input clock signals, an output of said switching over unit being connected to an input node of said preset clock propagation path.

7. The synchronous delay circuit as defined in claim 3 wherein there is provided a switching over unit for switching over between an output of each second delay circuit chain of each synchronous delay circuit, and said input clock signals, an output of said switching over unit being connected to an input node of said preset clock propagation path.

8. The synchronous delay circuit as defined in claim 2 wherein said delay detection circuit comprises a flipflop that is reset responsive to said clock signals reaching said input node of said preset clock propagation path and set responsive to said clock signals reaching said preset output node of said preset clock propagation path.

9. The synchronous delay circuit as defined in claim 3 wherein said delay detection circuit comprises a flipflop that is reset responsive to said clock signals reaching said input node of said preset clock propagation path and set responsive to said clock signals reaching said preset output node of said preset clock propagation path.

10. A semiconductor integrated circuit apparatus in which a clock signal supplied to a clock propagation path is controlled using a plurality of sets of synchronous delay circuits, said semiconductor integrated circuit comprising:
(a) each set of said plurality of sets of synchronous delay circuits including a first delay circuit chain for period measurement, along which input clock signals propagate, and a second delay circuit chain, allowing the input clock signals to propagate through a length corresponding to a length of propagation of said input clock signals through said first delay circuit chain; and
(b) delay detection circuits each controlling operation of one said first delay circuit chain, said delay detection circuits each detecting a propagation delay time required for propagating clock signals from an input node to a preset output node of a preset clock propagation path, each said delay detection circuit outputting a control signal for controlling said one first delay circuit chain to cease the propagation of the input clock signals based upon, at least in part, said propagation delay time;
(c) wherein delay (td) is introduced by at least one delay circuit to an input of at least one of said delay detection circuits to differentiate at least one delay time as detected in said at least one of said delay detection circuits from delay times detected by the other delay detection circuits, to differentiate at least one detected period quantity detected in the at least one of said first delay circuit chain controlled by said at least one of said delay detection circuits from a detected period quantity detected in each said first delay circuit chain controlled by each of said other delay detection circuits, so that, even when the relative relation in the magnitudes of the propagation delay time (tCTS) of said preset clock propagation path and a clock period (tCK) of the input clock signals is changed to cause discontinuity in clock signals from a given one of said sets of the synchronous delay circuits, clock signals synchronized with the input clock signals are output from another of the sets of the synchronous delay circuits and routed to said preset clock propagation path.

11. A semiconductor integrated circuit apparatus for controlling clock signals supplied to a clock propagation path using synchronous delay circuits, comprising:
(a) a first synchronous delay circuit including a first delay circuit chain for period measurement, that allows propagation of input clock signals and a second delay circuit chain, said second delay circuit chain allowing the input clock signals to propagate through a length corresponding to a length traversed by said input clock signals through said first delay circuit chain; and
(b) a first delay detection circuit for detecting a propagation delay time (tCTS) in propagating the clock signals from an input node to a preset output node of the clock propagation path and outputting a first control signal for controlling said first delay circuit chain to cease the propagation of the input clock signals for a period of time based upon, at least in part, said propagation delay time;
(c) a second synchronous delay circuit including a third delay circuit chain, for period measurement, that allows propagation of input clock signals and a fourth delay circuit chain, said fourth delay circuit chain allowing the input clock signals to propagate through a length corresponding to a length traversed by said input clock signals through said third delay circuit chain; and (d) a second delay detection circuit for detecting the propagation delay time (tCTS) in propagating the clock signals from the input node to the preset output node of the clock propagation path and outputting a second control signal for controlling said third delay circuit chain to cease the propagation of the input clock signals for a period of time based upon, at least in part, said propagation delay time;

(e) wherein outputs of said second and fourth delay circuit chains are fed to said input node of said clock propagation path through a switching over unit.

12. The semiconductor integrated circuit as defined in claim 11 wherein a first delay circuit having a fixed delay time is provided between said preset output node in said clock propagation path and an input terminal of said second delay detection circuit, and a second delay circuit having said fixed delay time is inserted between an output of said fourth delay circuit chain and an input terminal of said switching over unit.

13. The semiconductor integrated circuit as defined in claim 11 wherein delay circuit elements forming said first delay circuit chain comprise clocked inverters on-off controlled by said control signal.

14. The semiconductor integrated circuit as defined in claim 11 wherein said first and second delay detection circuits are flipflops being reset and set by said clock signals reaching said input node of said clock propagation path and said clock signals reaching said preset output node of said clock propagation path.

15. The semiconductor integrated circuit as defined in claim 11 wherein a delay circuit having a fixed delay time is provided between said input node in said clock propagation path and an input terminal of said second delay detection circuit.

* * * * *